(12) United States Patent
Kasper et al.

(10) Patent No.: US 9,750,134 B2
(45) Date of Patent: Aug. 29, 2017

(54) METHOD FOR PRODUCING A PRINTED CIRCUIT BOARD WITH MULTILAYER SUB-AREAS IN SECTIONS

(71) Applicant: AT&S Austria Technologie & Systemtechnik Aktiengesellschaft, Leoben (AT)

(72) Inventors: Alexander Kasper, Graz (AT); Dietmar Drofenik, Spielberg (AT); Ravi Hanyal Shivarudrappa, Leoben (AT); Michael Gössler, Kobenz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 14/773,201

(22) PCT Filed: Mar. 5, 2014

(86) PCT No.: PCT/AT2014/050052
§ 371 (c)(1),
(2) Date: Sep. 4, 2015

(87) PCT Pub. No.: WO2014/134650
PCT Pub. Date: Sep. 12, 2014

(65) Prior Publication Data
US 2016/0007450 A1 Jan. 7, 2016

(30) Foreign Application Priority Data
Mar. 5, 2013 (CN) .................... 2013 2 0099721 U

(51) Int. Cl.
*H05K 1/03* (2006.01)
*H05K 1/02* (2006.01)
(Continued)

(52) U.S. Cl.
CPC .......... *H05K 1/0298* (2013.01); *H05K 1/028* (2013.01); *H05K 1/09* (2013.01); *H05K 1/115* (2013.01);
(Continued)

(58) Field of Classification Search
CPC ... H05K 1/02; H05K 1/11; H05K 1/16; H05K 1/18; H05K 7/02; H01L 21/02; H01L 21/48; H01L 21/52; H01L 23/48
(Continued)

(56) References Cited

U.S. PATENT DOCUMENTS 5,270,493 A * 12/1993 Inoue ................... H05K 1/0218
174/253
5,517,758 A * 5/1996 Nakamura .............. C23C 18/22
174/266
(Continued)

FOREIGN PATENT DOCUMENTS

AT WO 2011003123 A1 * 1/2011 ............. H05K 1/142
EP 2141972 A1 1/2010
(Continued)

OTHER PUBLICATIONS

International Preliminary Report on Patentability for International Application No. PCT/AT2014/050052, Report Completed Jul. 30, 2015, Mailed Jul. 30, 2015, 14 Pgs.
(Continued)

*Primary Examiner* — Xiaoliang Chen
(74) *Attorney, Agent, or Firm* — KPPB LLP

(57) ABSTRACT

A method for producing a printed circuit board (13, 15, 16) with multilayer subareas in sections, characterized by the following steps: a) providing at least one conducting foil (1, 1') and application of a dielectric insulating foil (3, 3') to at least one subarea of the conducting foil; b) applying a structure of conducting paths (4, 4') to the insulating layer (3,
(Continued)

3'); c) providing one further printed circuit board structure; d) joining of the further printed circuit board structure with the conducting foil (1, 1') plus insulating layer (3, 3') and conducting paths (4, 4') by interposing a prepreg layer (5, 85; 18, 18'), and e) laminating the parts joined in step d) under pressing pressure and heat; and a printed circuit board produced according to this method.

8 Claims, 6 Drawing Sheets

(51) Int. Cl.
    *H05K 3/46*         (2006.01)
    *H05K 1/09*         (2006.01)
    *H05K 1/11*         (2006.01)
    *H05K 1/16*         (2006.01)
    *H05K 3/00*         (2006.01)
    *H05K 3/10*         (2006.01)
    *H05K 3/42*         (2006.01)

(52) U.S. Cl.
    CPC .......... *H05K 1/162* (2013.01); *H05K 3/0047* (2013.01); *H05K 3/10* (2013.01); *H05K 3/429* (2013.01); *H05K 3/4611* (2013.01); *H05K 3/4682* (2013.01); *H05K 3/4691* (2013.01); *H05K 3/4694* (2013.01); *H05K 2201/0355* (2013.01); *H05K 2201/096* (2013.01); *H05K 2203/061* (2013.01); *H05K 2203/063* (2013.01)

(58) Field of Classification Search
    USPC ........ 174/255, 252–254, 256, 260–264, 266; 361/760, 761, 763, 764, 793; 29/832, 29/841, 846, 854, 852
    See application file for complete search history.

(56) References Cited

U.S. PATENT DOCUMENTS

| | | | | |
|---|---|---|---|---|
| 7,359,213 | B2* | 4/2008 | Vasudivan | H05K 1/0231 174/262 |
| 2002/0118523 | A1* | 8/2002 | Okabe | H01L 21/4857 361/793 |
| 2005/0155792 | A1* | 7/2005 | Ito | H05K 3/4069 174/264 |
| 2007/0124925 | A1* | 6/2007 | Nakamura | H01L 21/6835 29/830 |
| 2007/0125575 | A1* | 6/2007 | Inui | H01L 21/4857 174/262 |
| 2007/0147014 | A1* | 6/2007 | Chang | H05K 1/162 361/760 |
| 2008/0212299 | A1* | 9/2008 | Kim | H05K 1/162 361/763 |
| 2008/0289865 | A1* | 11/2008 | Nakamura | H05K 1/162 174/260 |
| 2009/0039514 | A1* | 2/2009 | Jobetto | H01L 21/56 257/758 |
| 2009/0046441 | A1* | 2/2009 | Funaya | H01L 21/6835 361/783 |
| 2009/0085691 | A1* | 4/2009 | Kim | H05K 1/0231 333/185 |
| 2009/0231820 | A1* | 9/2009 | Tanaka | H01L 23/49822 361/764 |
| 2009/0244864 | A1* | 10/2009 | Kim | H05K 1/162 361/763 |
| 2009/0321921 | A1* | 12/2009 | Hwang | H01L 23/13 257/701 |
| 2010/0103634 | A1* | 4/2010 | Funaya | H01L 23/5389 361/761 |
| 2011/0120754 | A1* | 5/2011 | Kondo | H01L 23/14 174/254 |
| 2011/0220404 | A1* | 9/2011 | Yamasaki | H01L 21/486 174/261 |
| 2013/0118791 | A1* | 5/2013 | Okamoto | H05K 1/186 174/260 |
| 2013/0194764 | A1* | 8/2013 | Mikado | H05K 1/185 361/761 |

FOREIGN PATENT DOCUMENTS

| | | |
|---|---|---|
| WO | 2011003123 A1 | 1/2011 |
| WO | 2011026165 A1 | 3/2011 |

OTHER PUBLICATIONS

International Search Report and Written Opinion for International Application No. PCT/AT2014/050052, Report Completed Aug. 15, 2014, Mailed Aug. 29, 2014, 8 pgs.

* cited by examiner

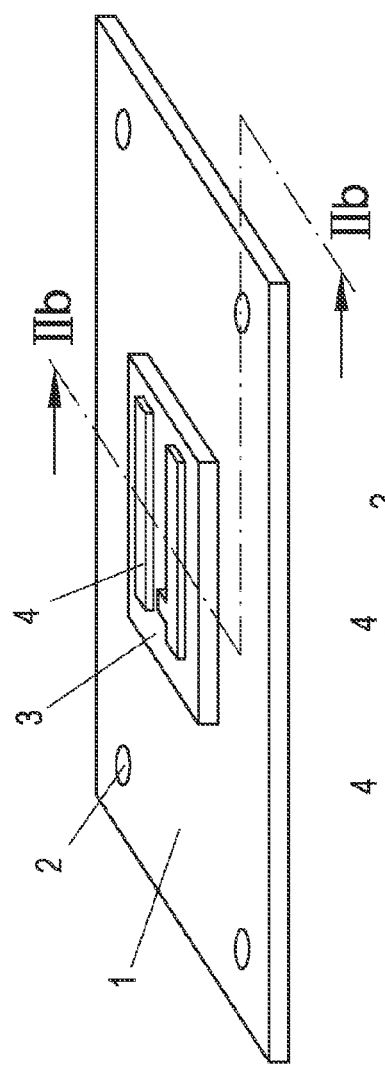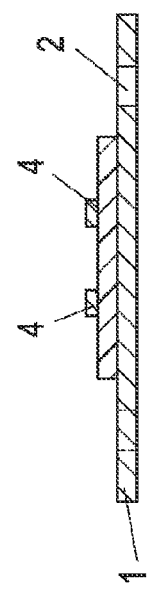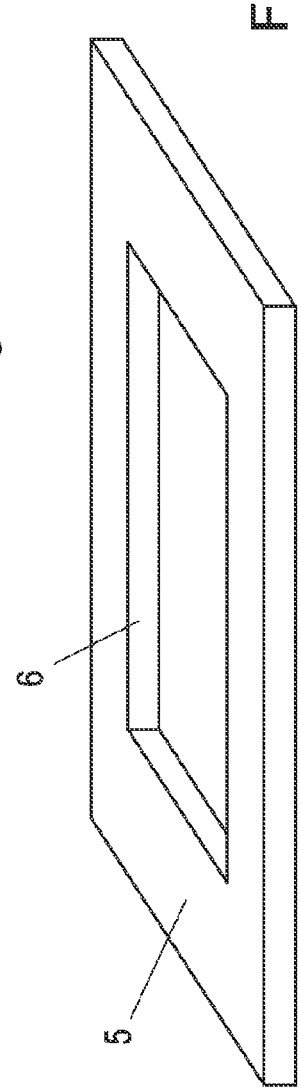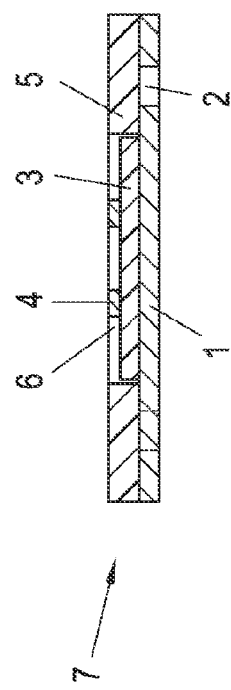

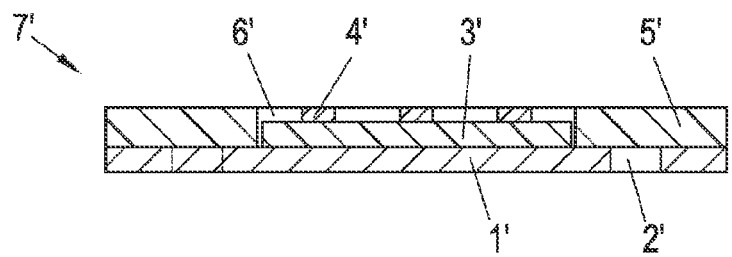
Fig. 3
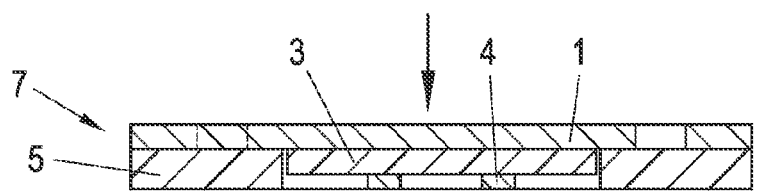
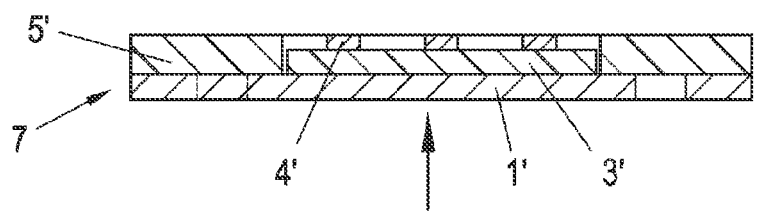
Fig. 4
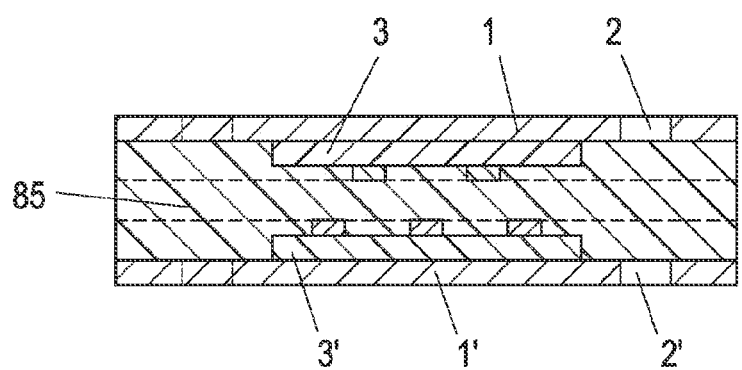
Fig. 5

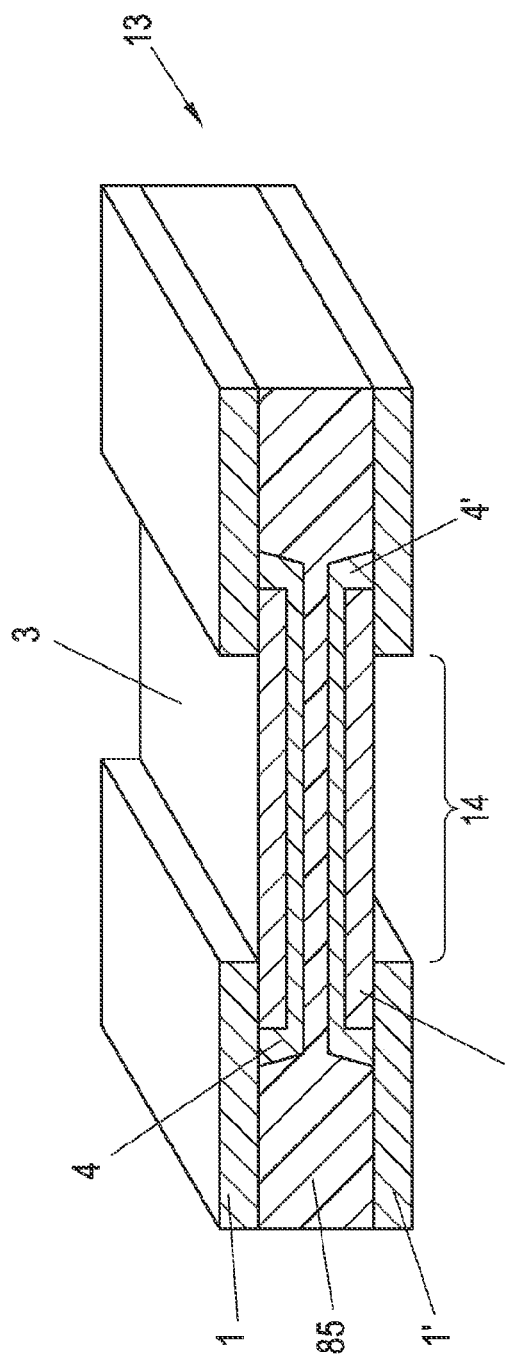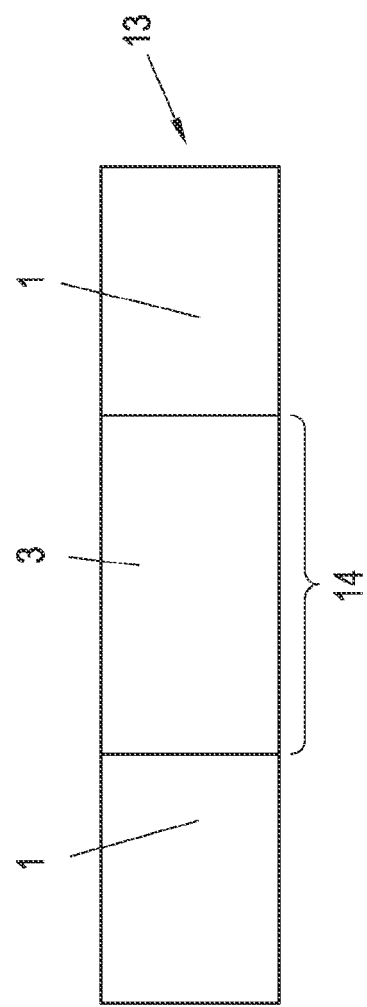

METHOD FOR PRODUCING A PRINTED CIRCUIT BOARD WITH MULTILAYER SUB-AREAS IN SECTIONS

CROSS REFERENCED APPLICATIONS

This application is a national stage of PCT/AT2014/050052 filed on Mar. 5, 2014, which application claims priority to Chinese Application No. 201320099721.3 filed Mar. 5, 2013, the disclosures of which are hereby incorporated by reference in their entirety.

The invention further relates to a printed circuit board produced according to the method.

A method and a printed circuit board (PCB) produced by means of the method are known from WO 2011/003123A1 (AT&S). The printed circuit board comprises two or more PCB subareas in this case, wherein each subarea comprises at least one conducting layer or components or conducting units. The subareas are mechanically or electrically connected with each other on their lateral surfaces. At least one conducting layer is applied to the subareas which can be arranged in single-layer or multilayer configuration, from which throughplatings lead to conducting layers or components of the subareas. The specification describes several variants concerning the insertion of the subareas into a larger printed circuit board area or a base plate, and also concerning the mechanical and electrical connections between mutually adjacent subareas. A combination of rigid and flexible printed circuit board areas are provided in one variant.

WO 2011/026165A1 (AT&S) also describes a printed circuit board which consists of two or more subelements, which are connected at their lateral edges with other elements or a larger common element, wherein the lateral edges may comprise structures for interlocking mutual engagement. In the production of the printed circuit board, the individual elements which can be arranged in multiple layers for example are joined by leaving a distance of 200µ and are connected with each other subsequently by introducing an adhesive and subsequent curing. The described method is provided for the purpose of facilitating the production of the printed circuit board on the one hand and the purposeful exchange of a subarea by cutting along the adhesive joint on the other hand.

US 2009/0321921 A1 (Hwang) discloses a semiconductor package which comprises two surfaces and which has a printed circuit board in the interior, with a semiconductor module being housed in a depression of a layer formed from insulating material and being connected with a first conducting structure which is provided on the inside of an insulating layer of the first surface. A second conducting structure is provided externally on the second surface and throughplatings are provided between the two conducting structures. A further semiconductor component is provided on the outside of the insulating layer of the first surface, which semiconductor component is connected with the conducting structure via electric bonding through holes in the insulating layer. The further semiconductor component is embedded in a moulding compound covering the entire first surface and solder balls are provided on the second surface of the packing for connection with a circuit arrangement or circuit board.

US 2010/0103634 A1 (Funaja-NEC) relates to printed circuit boards with electronic components such as integrated circuits which are embedded in resin, with a printed circuit board having conducting structures on both of its surface sides and the components being directly connected from the inside with a conducting layer. Printed circuit boards are also shown which respectively comprise two conducting structures on each of its surface sides which are separated by an insulating layer and in which all four conducting structures can respectively be connected via throughplatings. The specification also describes the stacking of two such printed circuit boards and the electrical or mechanical connection by means of a conducting paste or an adhesive layer.

EP 2 141 972 A1 (Murata) discloses a printed circuit board module in which a first component (e.g. integrated circuit) of relatively large height and a second subcomponent on a conducting structure are arranged on a basic printed circuit board with conducting structures on both of its sides. The subcomponent consists on its part of a sub-basic printed circuit board similarly with conducting structures on both of its sides, with further circuit components (e.g. integrated circuits) of lower height than the first component however being arranged on a conducting layer. The components of the subcomponent are embedded in a resin layer and covered upwardly by a shield electrode. The first component and the subcomponent, which approximately have the same height and are now disposed on the basic printed circuit board, are also embedded in resin and upwardly covered by a second shield electrode. Throughplatings connect the two shield electrodes and throughplatings are also provided between the two conducting structures both of the basic printed circuit board as well as the sub-basic printed circuit board.

It is the object of the invention to provide a printed circuit board which comprises multilayer subareas in sections without leading to the known problems in inserting a multilayer printed circuit board area into a provided printed circuit board such as cutting out a respective free space, aligning the subarea with the remainder of the printed circuit board, electrical connection of the four-layer subarea for example with the two-layer printed circuit board etc.

This object is achieved by a method of the kind mentioned above which is determined in accordance with the invention by the following steps:
a) providing at least one conducting foil and application of a dielectric insulating foil (3, 3') to at least one subarea of the conducting foil;
b) applying a structure of conducting paths to the insulating layer;
c) providing one further printed circuit board structure;
d) joining of the further printed circuit board structure with the conducting foil plus insulating layer and conducting paths by interposing a prepreg layer, and
e) laminating the parts joined in step d) under pressing force and heat.

The following steps can be provided in an advantageous embodiment of the invention:
a') providing a first conducting foil and applying a dielectric insulating layer (3) to at least one subarea of the first conducting foil;
b') applying a structure of conducting paths to the insulating layer of the at least one subarea;
c') providing a second conducting foil;
d') providing a prepreg layer and joining of the at least one subassembly as produced in steps a') and b') and at least the second conducting foil, wherein the third prepreg layer is provided between the conducting foils and the conducting foils are disposed on the outside;
e') laminating the structure assembled in step d') under pressing force into an assembly;

f') structuring of at least one of the two conducting foils disposed on the assembly on the outside for forming conducting paths;

g') producing holes through at least one of the insulating layers up to inwardly disposed conducting paths and production of throughplatings from conducting paths disposed on the outside to conducting paths disposed on the inside.

An appropriate variant of the invention is provided by the following steps:

a') providing a first conducting foil and application of a dielectric insulating layer (3) to at least one subarea of the first conducting foil;

b') applying a structure of conducting paths to the insulating layer of the at least one subarea;

ba') covering the first conducting foil by a prepreg layer whose dimensions substantially correspond to those of the first conducting foil;

c') providing a second conducting foil, and ca') applying a dielectric insulating layer to at least one subarea of the second conducting foil;

cb') applying a structure of conducting paths to the insulating layer of the at least one subarea;

cc') covering the second conducting foil by a second prepreg layer whose dimensions substantially correspond to those of the second conducting foil;

da') providing a third prepreg layer and joining of the first subassembly produced in the steps a') to c') and the second subassembly produced in the steps d') to f') into one subassembly, with the prepreg layer being provided between the subassemblies and the conducting paths of both subassemblies being situated opposite of one another;

ea) laminating the first subassembly with the third prepreg layer and the second subassembly under pressing force and heat into an assembly;

f) structuring of at least one of the two conducting foils disposed on the assembly on the outside for forming conducting paths;

g) producing holes through at least one of the insulating layers up to inwardly disposed conducting paths and production of throughplatings from externally disposed conducting paths to internally disposed conducting paths.

The following step is provided after step b) in a further advantageous variant:

ba') covering of at least one of the conducting foils by a prepreg layer whose dimensions substantially correspond to those of the first conducting foil.

In order to obtain a smooth surface without any bulging it is advantageous if the prepreg layer comprises a recess whose size and geometry correspond to the size and geometry of the dielectric layer.

The correct joining of the individual layers will be promoted when alignment marks are formed in the first and second conducting foil.

The method will be especially cost-effective when the insulating layers are applied by using a screen-printing process and/or the conducting paths are applied by means of a printing process.

It is highly advantageous for the method if in step g) the production of throughplatings occurs by means of a conducting paste and/or the holes are produced in step g) by laser drilling.

The object is also achieved by means of a printed circuit board of the kind mentioned above, which is produced by a method in accordance with the invention in which a first and a second outer conducting foil is provided a dielectric insulating layer is arranged in at least one subarea on the inside of at least one conducting foil, with the at least one dielectric insulating layer comprising conducting paths on its inside surface which are connected via at least one throughplating with the adjacent conducting foil, and the remaining space between the outwardly disposed conducting foils is filled by a prepreg layer.

In an appropriate variant, the at least one conducting foil is structured on its outer surface.

In order to achieve flexibility of the printed circuit board it can be provided that it is provided with a thinner configuration in a middle region in that the two outwardly disposed conducting foils are partly removed.

In order to simplify the configuration and to save costs it can be provided that the conducting paths are arranged as a capacitor together with an area of the prepreg layer disposed between said conducting paths.

It can be provided in an economically producible variant that the insulating layers are printed onto the conducting foils.

It can also be advantageous when the conducting paths are printed onto the insulating layers.

It can be provided in a further variant that the further printed circuit board structure is a conventional printed circuit board.

The invention plus further advantages are explained below in closer detail by reference to embodiments which are shown by way of example in the drawings, wherein:

FIG. 2a shows a diagrammatic illustration of the conducting paths applied to the insulating layer;

FIG. 2b shows a sectional view along the line IIb-IIb of FIG. 2a;

FIG. 2c shows a diagrammatic illustration of a first prepreg layer with a recess;

FIG. 2d shows a subassembly of the printed circuit board after joining the parts according to FIGS. 2b and 2c;

FIG. 3 shows a sectional view of a subassembly of the printed circuit board produced in an analogous fashion;

FIG. 4 shows the joining of the subassemblies with a further prepreg layer without a recess;

FIG. 5 shows a sectional view of the assembly obtained after the joining of the parts of FIG. 4;

FIG. 8 shows a diagrammatic illustration of a variant of the printed circuit board in accordance with the invention with a flexible middle part;

FIG. 9 shows a top view of the assembly according to FIG. 8;

The method according to the invention for producing a multilayer printed circuit board will be described below by reference to FIGS. 1 to 10.

A first conducting foil 1 such as an 18 μm Cu foil will be provided (FIG. 1a), which in the illustrated embodiment is rectangular and may also comprise four alignment marks 2 or holes in the region of its corners. The alignment marks 2 are introduced beforehand into the Cu foil and are used to align a subsequent screen-printing step thereon. The same alignment marks 2 can then be used at a later time for a photo step as a reference for example and ensure that the printed structure is in alignment with the "photo structure". Furthermore, these alignment marks may also be used to align the individual Cu foils with the printed structures.

Figure 1A:
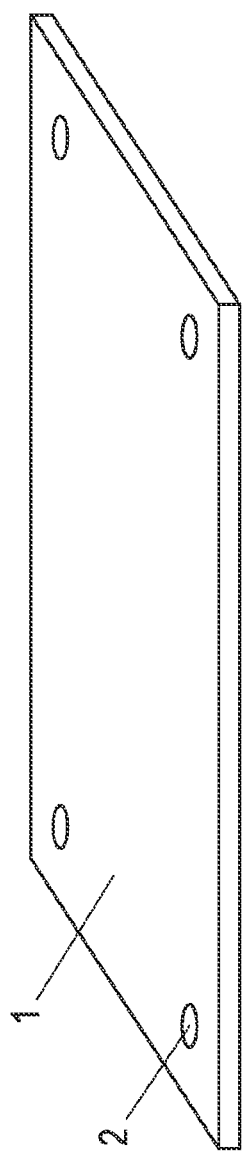
FIGS. 1a and 1b show a diagrammatic illustration with the provision of a first conducting layer with a dielectric insulation.
Figure 1B:
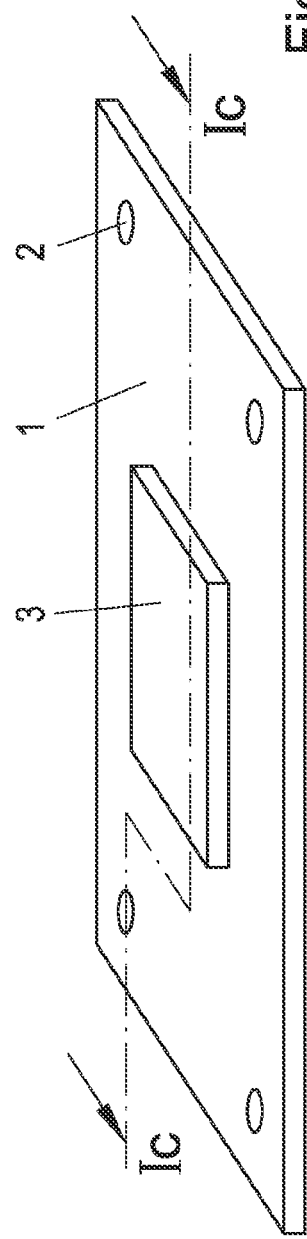
Figure 1C:
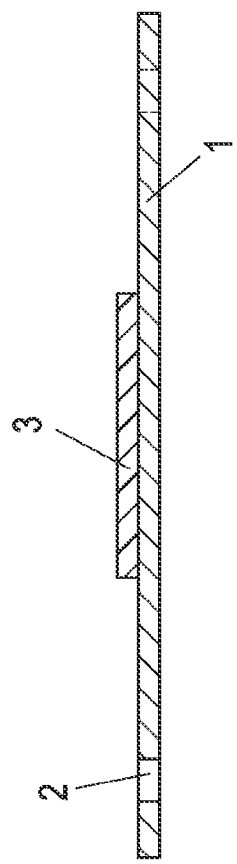
FIG. 1c shows a sectional view along the line Ic-Ic of FIG. 1b.

An insulating layer 3 will then be printed on a side of the first conducting foil 1, which covers a subarea of the conducting foil 1. This dielectric layer can consist of a material on the basis of epoxy and can be applied by using the alignment marks 2 for the correct application by means of a screen printing process. The typical thickness of the dielectric layer lies between 5 and 40 µm for example. The first conducting foil 1 with the applied insulating layer 3 is shown in FIGS. 1b and 1c.

Conducting paths 4 are applied in a next step to the insulating layer 3, for which purpose a printing process (especially inkjet printing) is similarly suitable. The conducting paths which consist of copper for example typically have a thickness 1 to 20 µm.

A first prepreg layer 5 will be provided thereupon, whose dimensions correspond to those of the conducting foil 1 and which comprises a recess 6 in a preferred embodiment whose size and geometry correspond to the size and geometry of the dielectric layer 3. In other words, the recess 6 can be larger to such a low extent that in the following step the prepreg layer 5 can be applied to the conducting foil 1 in such a way that the insulating layer 3 with the conducting paths 4 comes to lie within the recess 6, which is shown in FIG. 2d which shows a first subassembly 7 of the printed circuit board to be produced.

A second printed circuit board 1' will now be produced analogously according to the steps as shown in FIGS. 1a to 2d. This assembly therefore also comprises an insulating layer 3' on the conducting foil 1', and optionally alignment marks 2', conducting paths 4' on the insulating layer 3', wherein the layout can be different from the one of the conducting paths 4 on the first conducting foil 1, and a second prepreg layer 5' with a recess 6' corresponding to the insulating layer 3'.

Even though the insulating layer 3 of the first subassembly 7 and the insulating layer 3' of the second subassembly 7' have the same dimensions and geometry, it should be clear that although this may be advantageous from a production standpoint it is in no way mandatory.

Similarly, more than one area made of an insulating layer 3, 3' plus conducting paths 4, 4' could be provided on one or both conducting foils 1, 1'.

The layers 5, 5' with the recesses 6, 6' can be provided as printed dielectric materials in a partly polymerised state (B stage) and can be used in a subsequent pressing step as an adhesive layer.

A further third prepreg layer 8 will now be provided whose dimensions correspond to those of the two subassemblies 7, 7'. The two subassemblies 7, 7' are now brought to a mutual position in which the conducting paths 4 and 4' are now disposed opposite of one another, and the third prepreg layer 8 will be brought between the two subassemblies 7, 7', as shown in FIG. 4. The third prepreg layer 8 advantageously consists of the same material as the two prepreg layer's 5, 5'. Conventional prepregs can be used, e.g. on the basis of FR-4 in a thickness of between 30 and 250 µm or more.

This is followed by lamination under application of pressing force and heat, and optionally negative pressure (vacuum), indicated by the arrows in FIG. 4. In the course of said lamination, the prepreg layers 5, 8 and 5' join into a substantially uniform prepreg layer 85, and the assembly is obtained as shown in FIG. 5, which is now assigned the reference numeral 9.

Figure 6:
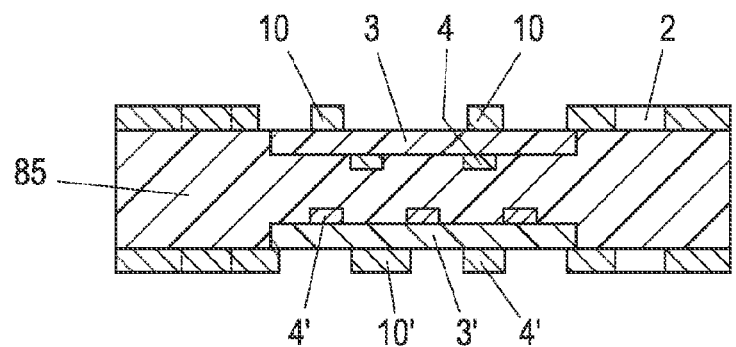
FIG. 6 shows the assembly according to FIG. 5 in a sectional view after the production of conducting paths on the two outsides surfaces.

In a subsequent step, the result of which is shown in FIG. 6, the conducting foils 1, 1' which are disposed on the outside on the assembly 9 of FIG. 5 are structured for forming conducting paths 10 and 10', wherein a conventional photolithographic process can be used with etching away of the areas of the conducting foils which are not required.

Holes can be produced through the insulating layers 3 and 3' up to the printed conducting paths 4 and 4' for electrically connecting the conducting paths 4, 4' disposed on the inside with the conducting paths 10, 10' disposed on the outside and are subsequently filled with conducting material (especially copper), wherein conventional methods such as copper plating or the use of a conducting paste can be used. The laser drilling methods are also suitable for producing the boreholes, provided that the dielectric insulating layers 3, 3' can be processed with the chosen laser. One can also consider ultra-short pulse lasers (picosecond lasers), since less material will be removed with one pulse during short pulse length and very good depth control can be achieved. The holes can optionally also be guided through contact pads of the external conducting paths 10, 10'.

Figure 7:
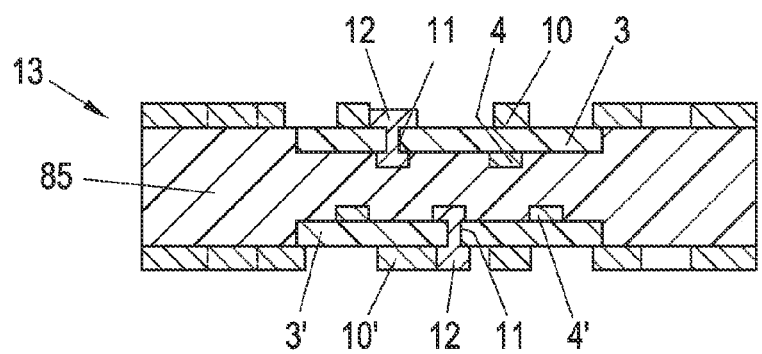
FIG. 7 shows the completed printed circuit board with connections between the inner and the outer conducting paths.

FIG. 7 shows a printed circuit board 13 after the production of the mentioned holes 11 and filling with conducting material for producing throughplatings/connections 12. The printed circuit board 13 is shown here in a not assembled state. It is understood that passive/active electronic/electrical components which are required for an electronic device or a specific application will be arranged on the conducting structures or conducting paths 10, 10'. This does not exclude the use of embedded components and the application of the respective technologies for "embedded components".

The term of "holes" shall generally comprise openings in connection with the invention. Consequently, the printed dielectric layers 3, 3' may comprise openings already after the printing, which will be filled during printing of the conducting paths 4, 4', thus achieving a bonding of the conducting paths 4 on the conducting foils 1, 1' and, after the structuring of the conducting foils, on the conducting paths 10, 10'. For the purpose of such a connection, holes in the insulating layers 3, 3' can also be produced by laser drilling or mechanical drilling and can also be filled by plating with copper.

It is clear that the invention provides a printed circuit board which is arranged in some areas as a three-layer or four-layer printed circuit board, namely in regions where one or two dielectric insulating layers 3, 3' are provided with the printed conducting paths.

One variant of the printed circuit board 13 according to the invention is shown in FIGS. 8 and 9. The starting point of this variant can be an assembly 9 according to FIG. 5, in which the conducting foils 1, 1' have been removed by etching for example in a middle region 14 on both sides, so that the insulating layers 3, 3' are exposed in this area 14. The remaining areas of the conducting foils 1, 1' can be structured for arranging conducting paths, which is not shown in FIGS. 8 and 9. The printed circuit board 13 which is produced in this manner is elastic, bendable or flexible in the middle region 14, i.e. an integral combination of rigid with flexible printed circuit boards is created in this manner in a simple way, with the flexible layer consisting of a conventional prepreg material and not being made of polyimide which is usually used for this purpose and which is difficult to process. This is possible because the copper layers have been etched away in this region on the one hand (which prevents bending to a high extent) and because on the other hand the insulating layers in this region are relatively thin.

If in the arrangement according to FIGS. 8 and 9 the conducting paths 4, 4' are arranged in the larger area, a very useful capacitor can be realised because the distance between the conducting paths/areas 4, 4' is kept at a low level by using a respectively thin third prepreg layer 8 and a respectively high capacitance of the capacitor formed in this manner can be obtained. As a result, buffer capacitors can be integrated for example in the printed circuit board, so that no external capacitors need to be placed. Furthermore, both the coatings and the dielectric of the capacitor are further protected in that they are situated on the inside.

In one variant of the invention, a capacitor can also be realised by respectively arranged conducting paths 4, 4' and 10, 10' with insulating layers 3, 3' as a dielectric. This leads to the possibility of arranging the insulating layers 3, 3' in a very thin manner, e.g. 10 µm. A capacitance of 10 nF is obtained in this case with a surface area of the capacitor layers (conducting paths 10, 10' and 4, 4') of 5×5 mm and an $\in_r$ of the layers 3, 3' of 4.

As already mentioned above, the dielectric insulating layers 3, 3' need not necessarily have the same size and geometry. In areas in which the insulating layers 3, 3' (as seen from above or below) overlap one another there is a four-layer printed circuit board. In areas in which there is only one insulating layer 3 or 3' (as seen from above or below again) there is a three-layer printed circuit board. The printed circuit board has two layers in all other areas.

Figure 10:
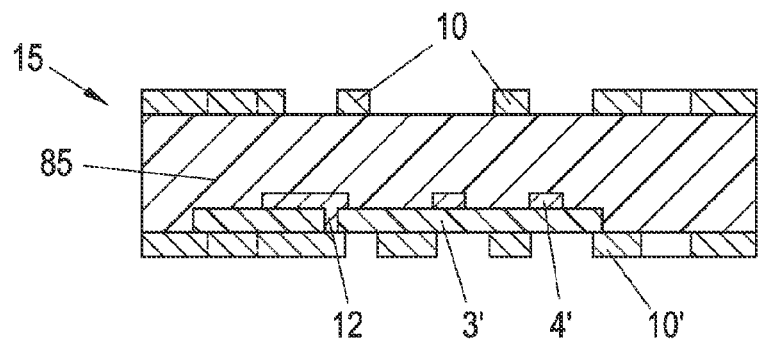
FIG. 10 shows another embodiment of a printed circuit board in accordance with the invention with a partly three-layer assembly in a sectional view.

On the basis of this, the invention also comprises a variant as shown in FIG. 10, in which a printed circuit board 15 comprises only one insulating layer 3' with printed circuit boards 4'. The production of such a printed circuit board 15 which has three layers in the region of the insulating layer occurs as described in FIGS. 1a to 7, but by omitting the insulating layer 3, the printed conducting paths 4 and the prepreg layer 5.

The described embodiments show the use of prepreg layer's 5, 5' with recesses 6, 6' and a prepreg layer 8 without recesses. The recesses 6, 6' take the thickness of the insulating layers 3, 3' with the conducting paths 4, 4' into account and allow the production of a printed circuit board of uniform thickness without any bulging or enlargements in the region of the insulating layers 3, 3' plus the conducting paths 4, 4'. It is obvious to the person skilled in the art that the invention also comprises the use of only one single prepreg layer 8 without recesses when omitting the prepreg layers 5, 5'. If the prepreg layer 8 has a larger thickness and the insulating layers 3, 3' with the conducting paths 4, 4' have a relatively low thickness, the aforementioned enlargement/bulging will not occur or only to a low extent. The presence of such enlargements may be acceptable readily to a low extent in some cases.

It should further be clear that a printed circuit board produced according to the invention can be pressed again with one or several printed circuit boards, so that several layers can be arranged in standard technology.

Figure 11:
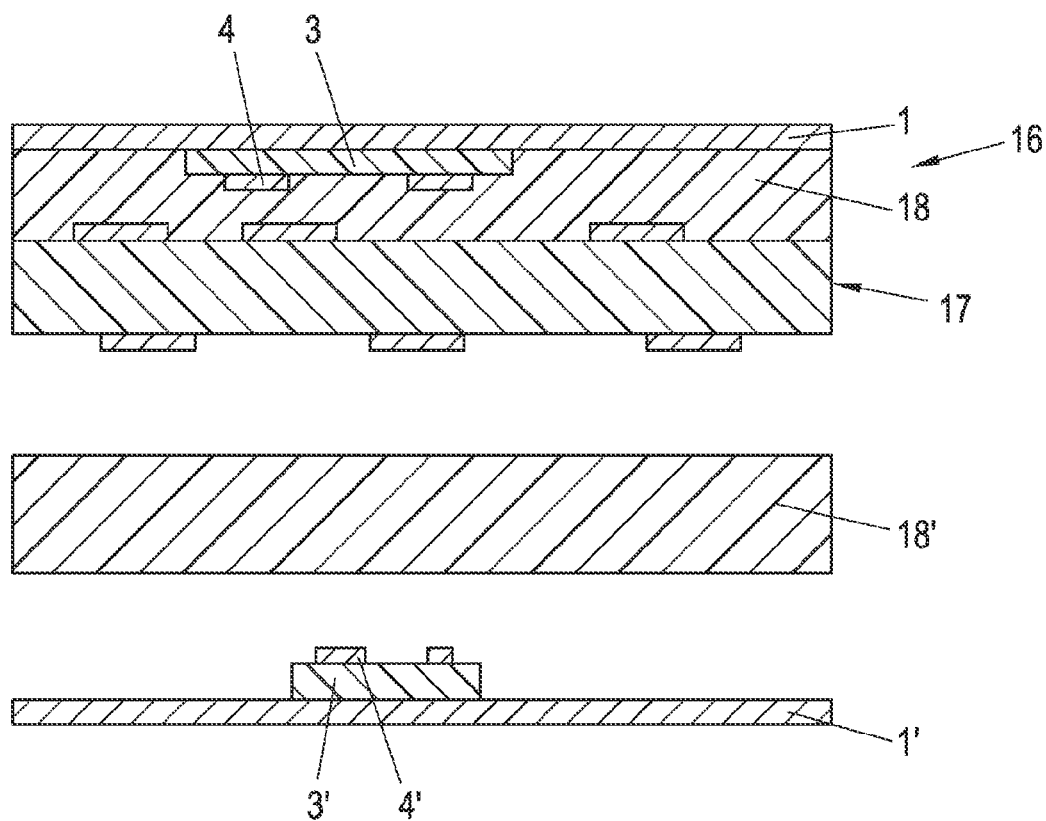
FIG. 11 shows a further variant of a printed circuit board according to the invention.

FIG. 11 shows another printed circuit board 16 of the invention, starting from a conventional PCB 17 according to the state of the art, in this case a double-sided PCB. This printed circuit board 16 is combined on one or on both sides with a conducting foil 1 or 1' having a printed dielectric layer 3, 3' with conducting paths 4, 4' as described above (see FIG. 2b), using a prepreg layer 18, 18'. In the upper part of FIG. 10 PCB 17 is already combined with foil 1 and its layer 3 and conducting paths 4, whereas in the lower part of FIG. 10 the conducting foil 1' with its layer 3' and conducting paths 4 and the prepreg layer are not yet bonded with the printed circuit board 17.

In the example shown in FIG. 11 both sides of a conventional PCB 17 are covered by conducting layers 1, 1' having dielectric layers 3, 3' and conducting paths 4, 4', but it should be clear that only one side of PCB 17 may be covered with a conducting layer 1, 1', its dielectric layer 3, 3' and the conducting paths 4, 4'. In this case too, conducting foils 1 and/or 1' may be structured to form conducting paths, and paths may be created, which connect areas of different conducting layers of the structure.

The invention claimed is:

1. A printed circuit board with multilayer subareas in sections, characterized in that:
   at least one externally disposed conducting foil is provided,
   a dielectric insulating layer attached to a subarea on an inside of the externally disposed conducting foil which inside of the conducting foil is opposite to the externally disposed side of the conducting foil,
   conducting paths attached to an inside surface of the dielectric insulating layer such that the dielectric insulating layer is arranged between the externally disposed conducting foil and the internal conducting paths,
   at least one prepreg layer attached to at least the exposed portions of the inside of the externally disposed conducting foil, the insulating layer, and the conducting paths, and being further attached at an opposite side with a further printed circuit board structure having at least a second externally disposed conducting foil attached thereto such that the prepreg is at least attached to at least an exposed portion of the inside of the second externally disposed conducting foil.

2. A printed circuit board according to claim 1, characterized in that a first and a second externally disposed conducting foil are provided, a separate at least one dielectric insulating layer is attached to at least one subarea on the inside of each of the conducting foils, each of the at least one dielectric insulating layers comprise conducting paths on its inside surface, which internal conducting paths are connected via at least one throughplating with the adjacent externally disposed conducting foil, and the remaining space between the externally disposed conducting foils is filled by a prepreg layer.

3. A printed circuit board according to claim 1, characterized in that the at least one conducting foil is structured on its exterior surface with conducting paths.

4. A printed circuit board according to claim 1, characterized in that it has a thinner configuration in a middle region in that the two externally disposed conducting foils are partially removed.

5. A printed circuit board according to claim 1, characterized in that the conducting paths are arranged as a capacitor together with a region of the prepreg layer being disposed between said paths.

6. A printed circuit board according to claim 1, characterized in that the insulating layers are printed onto the conducting foils.

7. A printed circuit board according to claim 1, characterized in that the conducting paths are printed onto the insulating layers.

8. A printed circuit board according to claim 1, characterized in that the further printed circuit board structure is a conventional printed circuit board.

\* \* \* \* \*